(12) United States Patent
Straznicky

(10) Patent No.: US 7,340,356 B2
(45) Date of Patent: Mar. 4, 2008

(54) METHOD AND SYSTEM FOR READING THE RESISTANCE STATE OF JUNCTIONS IN CROSSBAR MEMORY

(75) Inventor: Joseph Straznicky, Santa Rosa, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 82 days.

(21) Appl. No.: 11/010,597

(22) Filed: Dec. 13, 2004

(65) Prior Publication Data

US 2006/0129340 A1   Jun. 15, 2006

(51) Int. Cl.
*G01R 25/00* (2006.01)

(52) U.S. Cl. ....................................................... 702/65
(58) Field of Classification Search .................. 702/65; 365/232, 49; 327/365
See application file for complete search history.

(56) References Cited

U.S. PATENT DOCUMENTS

| 2004/0041617 A1* | 3/2004 | Snider et al. ............... 327/365 |
| 2004/0223352 A1* | 11/2004 | Snider .......................... 365/49 |
| 2005/0117441 A1* | 6/2005 | Lieber et al. ............... 365/232 |

* cited by examiner

*Primary Examiner*—John Barlow
*Assistant Examiner*—Xiuqin Sun

(57) ABSTRACT

Various embodiments of the present invention are directed to methods for determining the resistance state of nanowire-crossbar junctions, and can also be used to determine the resistance state of sub-microscale crossbar junctions. A pair of wires interconnected through the crossbar junction is biased to determine a first signal for the crossbar junction. The pair of wires interconnected through the crossbar junction is then biased again to increase the resistance of the crossbar junction. The pair of wires interconnected through the crossbar junction is then biased again to determine a second signal for the crossbar junction. The first signal is compared to the second signal to determine the resistance state of the crossbar junction.

20 Claims, 8 Drawing Sheets

METHOD AND SYSTEM FOR READING THE RESISTANCE STATE OF JUNCTIONS IN CROSSBAR MEMORY

STATEMENT OF GOVERNMENT LICENSE RIGHTS

The U.S. Government has a paid-up license in this invention and the right in limited circumstances to require the patent owner to license others on reasonable terms as provided for by the terms of Contract No. MDA972-01-3-005 awarded by the DARPA.

TECHNICAL FIELD

The present invention relates to electronic devices, and, in particular, to a method for determining the resistance states of crossbar-memory junctions.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating submicroscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Nanoscale memory devices can be constructed by fabricating simple electronic components, such as resistors and diodes, at positions of overlap between crossing nanowires or nanowire junctions. Nanoscale memory can be configured as read only memory ("ROM") or random-access memory ("RAM"). ROM is referred to as a "static" or "non-volatile" memory because the resistance of ROM electronic components is irreversible. On the other hand, RAM is referred to as a "dynamic" or "volatile" memory because the resistance state of RAM electronic components may be change over time. RAM typically employs electronic components that can store electrical charge. However, because the charge can readily dissipate, the charge needs to be regularly refreshed by periodically supplying current. The charge that dissipate and the current used to regularly refresh RAM components can produce a parasitic current that circulates throughout the nanoscale crossbar-memory lattice causing certain components to undergo a resistance state change. Therefore, designers, manufacturers, and users of nanoscale RAM have recognized the need for new methods that determine the resistance states of components located at nanowire junctions.

SUMMARY OF THE INVENTION

Various embodiments of the present invention are directed to methods for determining the resistance state of nanowire-crossbar junctions, and can also be used to determine the resistance state of sub-microscale crossbar junctions. A pair of wires interconnected through the crossbar junction is biased to determine a first signal for the crossbar junction. The pair of wires interconnected through the crossbar junction is then biased again to increase the resistance of the crossbar junction. The pair of wires interconnected through the crossbar junction is then biased again to determine a second signal for the crossbar junction. The first signal is compared to the second signal to determine the resistance state of the crossbar junction.

Various embodiments of the present invention are directed to systems for determining the resistance state of nanowire-crossbar junctions, and can also be used to determine the resistance state of sub-microscale crossbar junctions. The system of the present invention is composed of a means to bias pairs of wires interconnected through the crossbar junction. A means is employed to detect a signal reflective of the state of the crossbar junction. Logic is employed to bias a pair of wires interconnected through the crossbar junction to determine a first signal for the crossbar junction, then bias the pair of wires interconnected through the crossbar junction to increase the resistance of the crossbar junction, then bias the pair of wires interconnected through the crossbar junction to determine a second signal for the crossbar junction, and then compare the first signal to the second signal to determine the resistance state of the crossbar junction.

DETAILED DESCRIPTION OF THE INVENTION

Various embodiments of the present invention are directed to methods for determining the resistance state of electronic components located at nanowire overlapping points in nanoscale RAM devices. The present invention is described below in the following three subsections: (1) nanowire crossbars, (2) crossbar memory, and (3) embodiments of the present invention. Note that methods of the present invention can also be applied to larger scale semiconductor RAM devices.

Nanowire Crossbars

Figure 1:
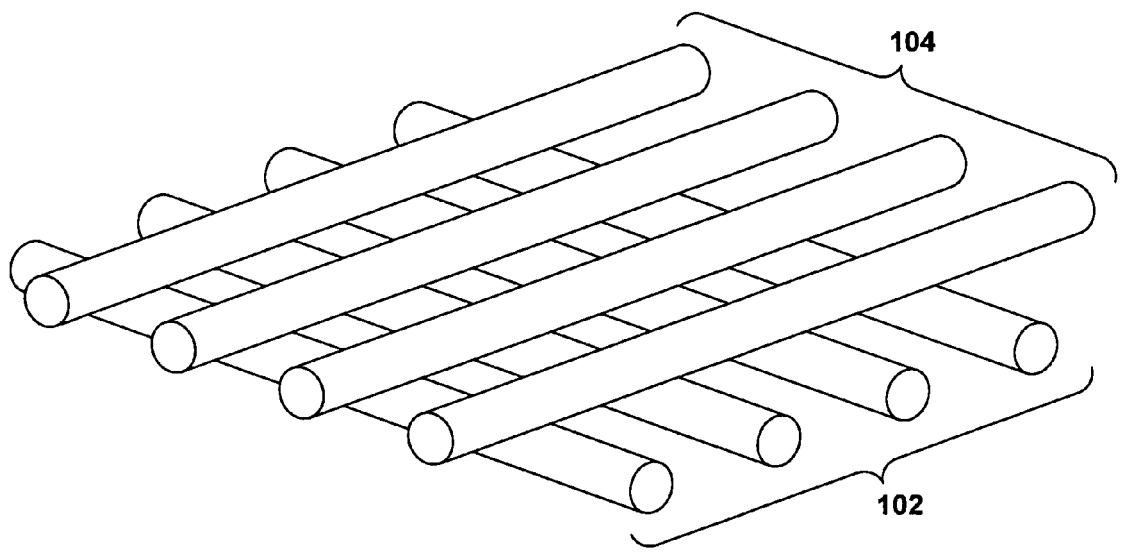
FIG. 1 illustrates a basic nanowire crossbar.
Figure 3A:
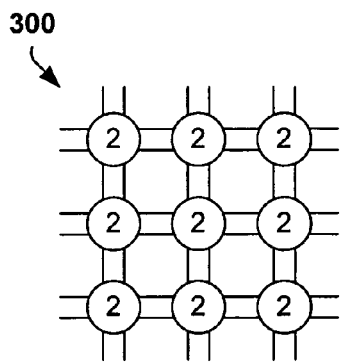
FIG. 3A-3D illustrates one possible approach for configuring a network of nanoscale electrical components from a two-layer nanowire crossbar.
Figure 3B:
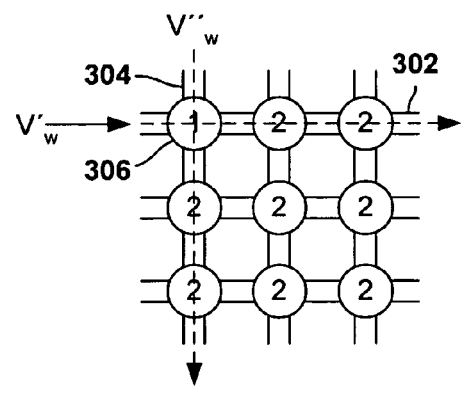
Figure 3C:
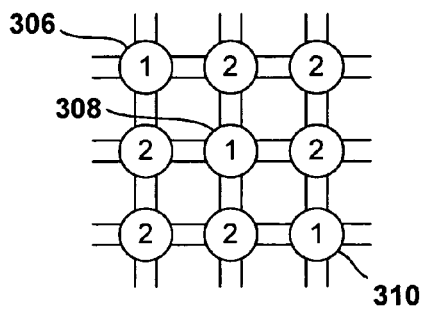
Figure 3D:
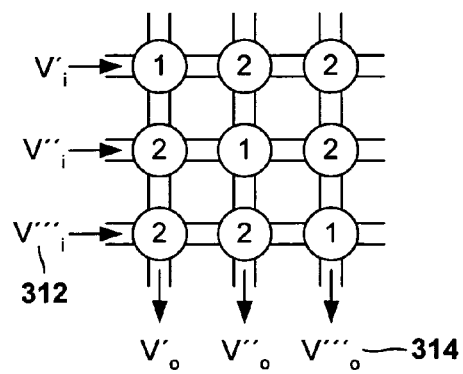

A relatively new and promising technology involves nanowire crossbars. FIG. 1 illustrates a two-layer nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at intersection points, or nanowire junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured via a relatively straightforward process. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
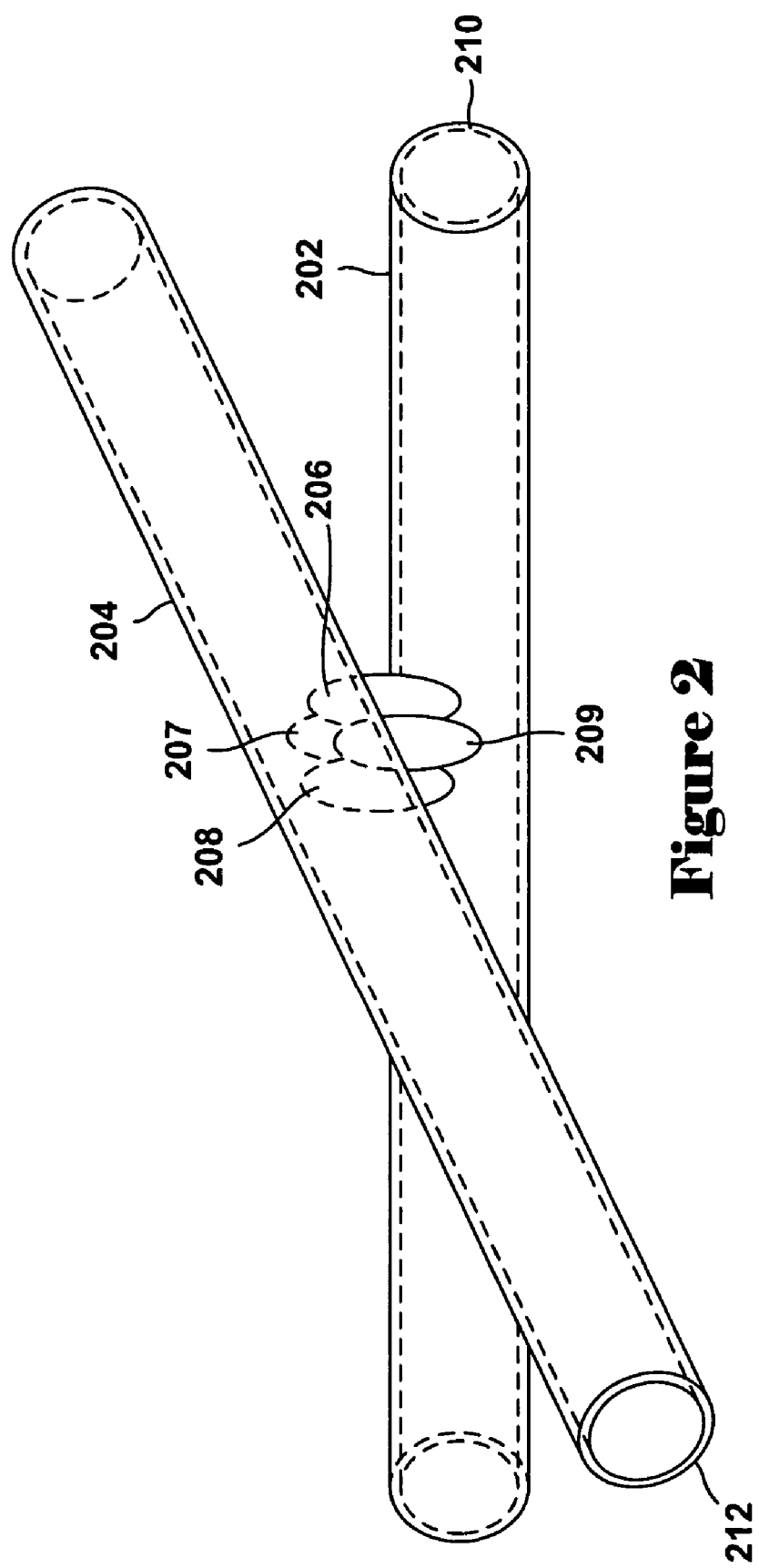
FIG. 2 illustrates a nanowire junction, or intersection, between two roughly orthogonal nanowires.

Nanowire crossbars are not only layers of relatively parallel conductive elements, but may also be used to create arrays of nanoscale electronic components, such as transistors, diodes, resistors, and other familiar basic electronic components. FIG. 2 illustrates a nanowire junction between nanowires of two contiguous layers within a nanowire crossbar. In FIG. 2, the nanowire junction between a first nanowire 202 of a first nanowire layer intersects a second nanowire 204 of a second nanowire layer. Note that the nanowire junction may or may not involve physical contact between the two nanowires 202 and 204. As shown in FIG. 2, the two nanowires are not in physical contact at their closest point of approach, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires intersecting at a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire junction molecules combined with nanowire junction molecules being uniformly oriented with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions indicate the state of the nanowire junction molecules. In one state, labeled "1" in FIGS. 3A-3D, the nanowire-junction molecules may have certain semiconductor, or conductive properties, while in a second state, labeled "2" in FIGS. 3A-D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a write voltage, or configuring voltage, to the nanowires that form the nanowire junction in order to configure, or program, the nanowire junction to have the state "1." For example, in FIG. 3B, a first write voltage $v_w'$ is applied to horizontal nanowire 302 and a second write voltage $v_w''$ is applied to vertical nanowire 304 to change the state of the nanowire junction 306 from "2" to "1." Individual nanowire junctions may be configured through steps similar to the steps shown in FIG. 3B to finally result in a fully configured nanoscale component network as shown in FIG. 3C. Note that, in FIG. 3C, the states of nanowire junctions 306, 308, and 310 that form a downward-slanted diagonal through the nanowire crossbar have been configured by selective application of write voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the write voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
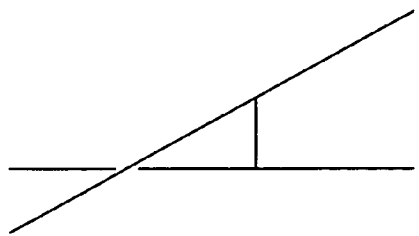
FIG. 4A-4F schematically illustrates a number of simple electrical components that can be programmed at the nanowire junctions of nanowires in nanowire crossbars.
Figure 4B:
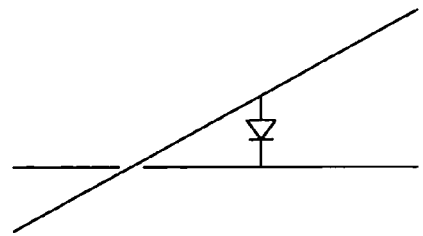
Figure 4C:
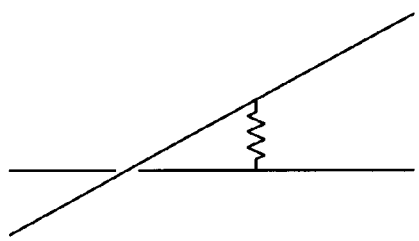
Figure 4D:
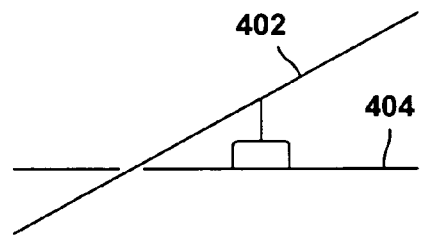
Figure 4E:
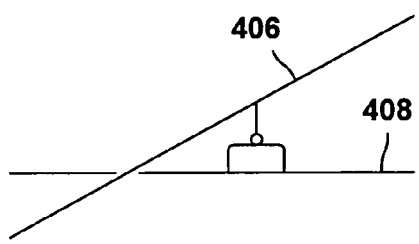
Figure 4F:
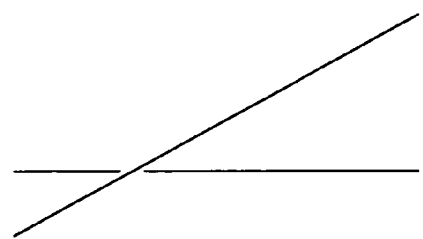

Nanowire junctions of nanowires in nanowire crossbars may be configured, in various techniques depending on the chemical nature of the nanowires and nanowire-junction-spanning molecules, to form a wide variety of different, simple electronic devices. FIG. 4 schematically illustrates a number of simple electrical components that can be configured at the nanowire junctions of nanowires in nanowire crossbars. A nanowire junction may represent (1) a simple conductive connection between the two nanowires, as shown in FIG. 4A; (2) a diode that conducts current in only one direction between the two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the overlapping of two conductive nanowires, with the voltage and current associated with each nanowire completely independent from one another, as shown in FIG. 4F. In the case of the nFET, shown in FIG. 4D, a relatively low voltage state on the gate wire 402 results in current passing through the source/drain wire 404, while a relatively high voltage on the gate wire 402 prevents conduction of current on the source/drain nanowire 404. The pFET of FIG. 4E exhibits opposite behavior, with a relatively high voltage on the gate wire 406 facilitating flow of current through the source/drain wire 408, and relatively low voltage on the gate wire 406 preventing the flow of current on the source/drain wire 408. Note also that a nanowire junction may also be configured as an insulator, essentially interrupting conduction at the nanowire junction with respect to both nanowires. Thus, as discussed above with reference to FIGS. 1-4, a two-dimensional nanowire crossbar may be constructed and then configured as a network of electrical components. Note also that a nanowire junction, although shown in FIGS. 4A-4F to comprise the nanowire junction of two single nanowires, may also comprise a number of nanowire junctions between a number of wires in a first layer of a nanowire crossbar that together comprise a single conductive element and the nanowires in a second nanowire layer that together comprise a second conductive element.

The configurable electrical resistance of nanowire junctions is an important and special property of certain types of nanowire junctions. When certain types of molecules are used for nanowire junctions, the initially relatively high resistance of the nanowire junction may be lowered by applying a relatively large positive voltage to the nanowire junction. The resistance of the nanowire junction can be a function of the magnitude of the highest voltage applied to the nanowire junction. By applying higher and higher positive voltages to a nanowire junction, the resistance of the nanowire junction can be made lower and lower. A relatively low resistance state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Figure 5:
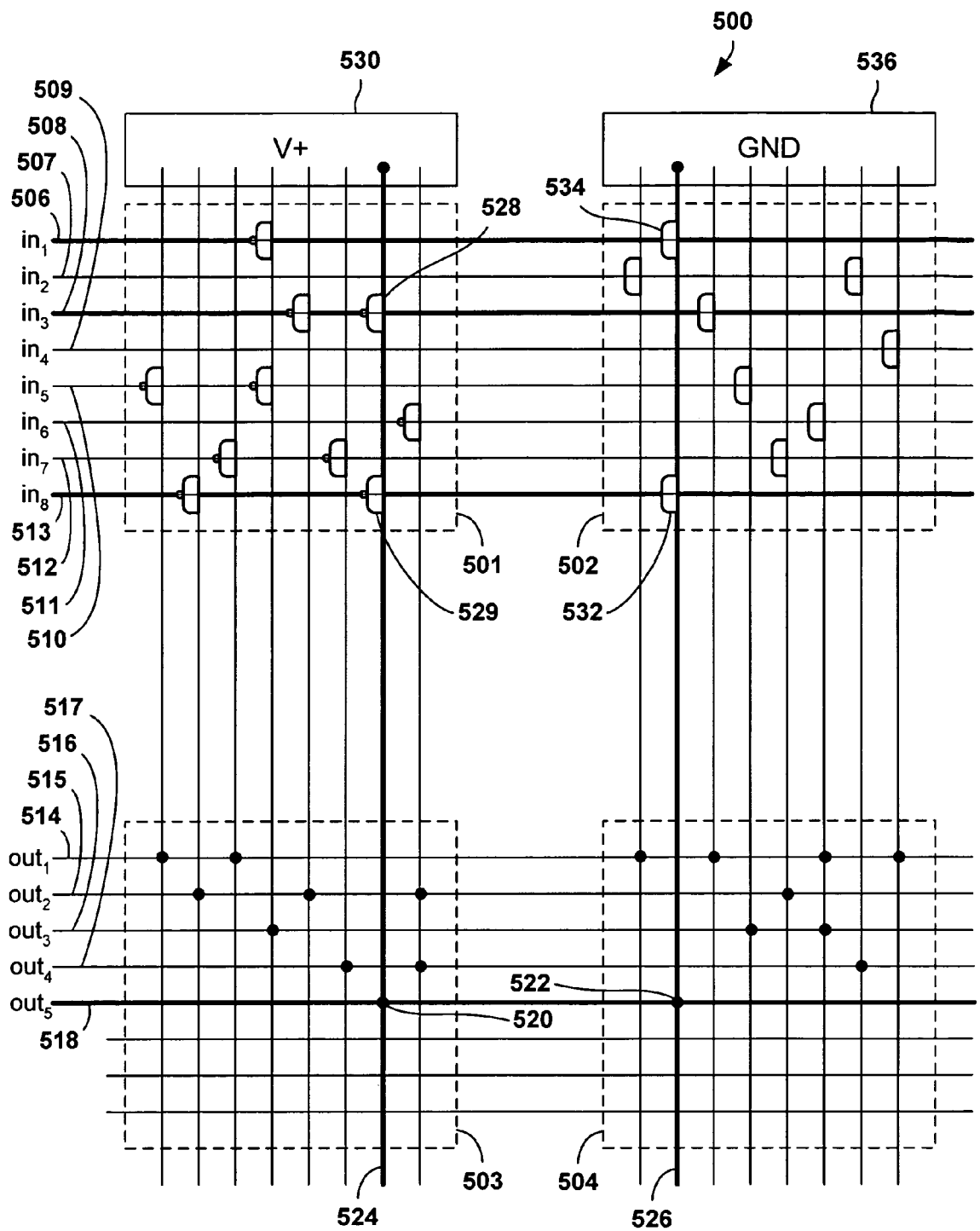
FIG. 5 illustrates an exemplary CS lattice.

A particularly useful type of nanoscale electronic component array based on nanowire-crossbar technology is referred to as a "complementary/symmetry lattice" ("CS lattice"). FIG. 5 illustrates an exemplary CS lattice. Note that, although CS lattices are generally configured to represent logical and useful circuits, the CS lattice in FIG. 5 is rather arbitrarily configured, and is shown not as a representation of a particular subcircuit implemented by the CS lattice, and may not even be useful or functional, but rather is included to show the basic features of the CS lattice itself. In general, because of the small scales of the nanowire-crossbar grids, it is difficult to chemically alter individual nanowire junctions. Techniques do exist for applying a very small number of molecules to a particular nanowire junction, but the techniques are painstakingly time consuming, and unsuitable for mass production. However, it is currently relatively straightforward to chemically alter subregions or microregions, comprising a number of nanowire junctions using currently available semiconductor manufacturing technologies. The term "microregion" is meant to indicate a scale larger than an individual nanowire junction, but not necessarily a particular range of dimensions. It is currently technically feasible to fabricate sub-micron-sized microregions, for example. In the exemplary CS lattice shown in FIG. 5, four distinct, square microregions, demarcated by dashed lines 501-504, are shown within the nanowire crossbar 500. Microregion 501 is chemically altered so that nanowire junctions within microregion 501 may be selectively configured as pFET components. Conversely, microregion 502 has been chemically altered so that nanowire junctions within microregion 502 may be selectively configured as nFET components. The microregions 503 and 504 have been chemically configured so that nanowire junctions within microregions 503 and 504 can be selectively configured as conductive links that electrically connect the nanowires forming the nanowire junctions. In certain embodiments, one set of parallel wires, the horizontal, conductive nanowires in FIG. 5, may be of nanoscale dimensions or of greater, sub-microscale or microscale dimensions, while the other set of parallel wires, the vertical semiconductive nanowires in FIG. 5, can be of nanoscale or microscale dimensions.

In a CS lattice, some number of nanowires is considered as a set of molecular input-signal lines. For example, in the CS lattice shown in FIG. 5, horizontal nanowires 506-513 are considered as inputs, and labeled "$in_1$"-"$in_8$." Similarly, a distinct set of wires is normally considered as a set of molecular output-signal lines. For example, in the CS lattice shown in FIG. 5, horizontal nanowires 514-518 are considered as molecular output-signal lines, and designated in FIG. 5 as "$out_1$"-"$out_5$." Consider, for example, molecular output-signal line, or horizontal nanowire, "$out_5$" 518. Proceeding along nanowire "$out_5$" 518 from left to right, it can be seen that molecular output-signal line "$out_5$" is connected via nanowire junction connections 520 and 522, denoted by small circles in the nanowire junctions, to vertical nanowires 524 and 526, respectively. Traversing these vertical nanowires 524 and 526, it can be seen that vertical nanowire 524 is connected with molecular input-signal line "$in_3$" 508 via a pFET 528 and connected with molecular input-signal line "$in_8$" 513 via a pFET 529. Thus, when molecular input-signal lines "$in_3$" 508 and "$in_8$" 513 are low, the pFETs 528 and 529 are activated to connect molecular output-signal line "$out_5$" with a high voltage source 530, potentially driving molecular output-signal line "$out_5$" to a high-voltage state. However, following vertical nanowire 526 upwards from the connection 522 to molecular output-signal line "$out_5$" 518, it can be seen that the vertical nanowire 526 interconnects with molecular input-signal line "$in_8$" 513 via a nFET 532 and interconnects with molecular input-signal line "$in_1$" 506 via nFET 534. Whenever molecular input-signal lines "$in_1$" and "$in_8$" are both in a high-voltage state, then the nFETs 532 and 534 are activated to interconnect the vertical nanowire 526 with ground 536, essentially shorting vertical nanowire 526 and molecular output-signal line "$out_5$" 518 to ground. When molecular input-signal lines "$in_1$" and "$in_8$" are high, then molecular output-signal line "$out_5$" 518 is low. When both of molecular input-signal lines "$in_1$" and "$in_8$" are low, and molecular input-signal line "$in_3$" is high, then molecular output-signal line "$out_5$" is undriven, and in a high impedance state. Thus, the state of molecular output-signal line "$out_5$" 518 depends only on the states of molecular input-signal lines "$in_1$," "$in_3$," and "$in_8$," and a truth table summarizing the response of molecular output-signal line to all possible input-signal-line-states can be provided as follows:

| $in_1$ | $in_3$ | $in_8$ | $out_5$ |
|---|---|---|---|
| 0 | 0 | 0 | 1 |
| 0 | 0 | 1 | high Z |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes, et al., U.S. Pat. No. 6,256,767B1; Kuekes, et al., U.S. Pat. No. 6,128,214; and Snider, et al., U.S. patent application Ser. No. 10/233,232.

Crossbar Memory

Figure 6:
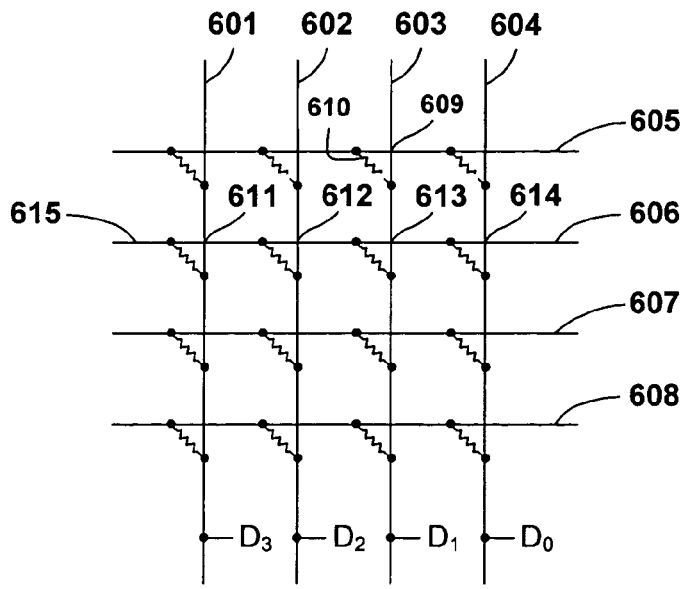
FIG. 6 illustrates a crossbar-memory lattice.

FIG. 6 illustrates a basic nanoscale crossbar-memory lattice. In FIG. 6, the crossbar-memory lattice is composed of two sets of parallel nanowires 601-608. The parallel nanowires of a first set 601-604 are approximately orthogonal to the parallel nanowires of a second set 605-608, and a nanowire junction is located at each point at which a horizontal nanowire overlaps a vertical nanowire. For example, nanowire junction 609 is located at the point that vertical nanowire 603 overlaps horizontal nanowire 605. In FIG. 6, the nanowire junctions are composed of resistor components, for example, resistor component 610 is located at the point of overlap between horizontal nanowire 605 and vertical nanowire 603. Note that various other electronic components can be fabricated at the nanowire junctions, including diodes, field effect transistors, simple conductors or other components. Current can enter the nanowire-crossbar-memory lattice on any one of the horizontal nanowires. The nanowire junctions located along the horizontal nanowire that are in low resistance states pass relatively large current levels to connected vertical nanowires. On the other hand, nanowire junctions located along the horizontal nanowire that are in high resistance states pass correspondingly lower current levels to connected vertical nanowires. For example, in FIG. 6, if nanowire junctions 611 and 612 are in low resistance states and nanowire junctions 613 and 614 are in high resistance states when current enters the nanowire-crossbar-memory lattice on horizontal nanowire 605, then a relatively high current level is passed to vertical nanowires 601 and 602, and a correspondingly lower current level is passed to vertical nanowires 603 and 604. Note that in many embodiments of crossbar memories, the resistance state of nanowire junctions can be changed by applying voltage or passing current through the nanowires. Note that either current or voltage can measured to determine junction resistance.

Binary words are used to store information in a crossbar memory. A binary word is a string of bits, often represented by "1s" and "0s," that can be used to represent a coded instruction, number, or letter. In certain implementations, the resistor-nanowire junctions along a horizontal nanowire are considered to be a register, and are used to store binary words in the crossbar memory. For example, in FIG. 6, each horizontal nanowire can be considered to be a register composed of four nanowire junctions that can each be used to store a 4-bit word, such as the 4-bit word "0110." Binary words are stored in the register by setting the resistance state at each nanowire junction connected to a horizontal nanowire. Nanowire junctions having a low resistance state correspond to high current output that can be associated with the bit value "1," and nanowire junctions having a high resistance state correspond to low current output that can be associated with the bit value "0." In FIG. 6, the output of a register of the nanowire-crossbar-memory lattice is represented by the 4-bit word $D_3D_2D_1D_0$, where each $D_i$ represents a bit. For example, if nanowire junction 609 is a high resistance nanowire junction, then the bit value of $D_1$ in the word $D_3D_2D_1D_0$ is "0."

Figure 7:
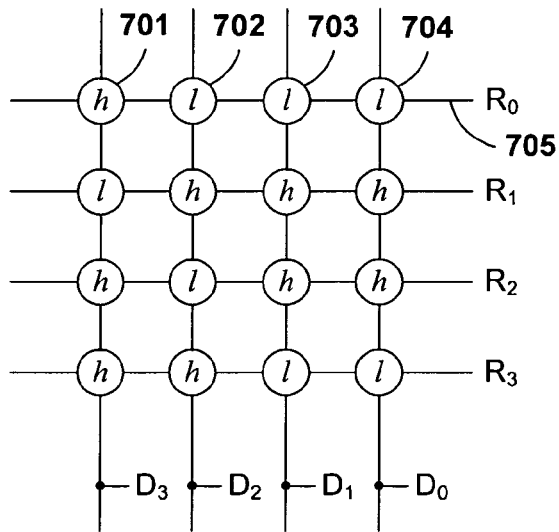
FIG. 7 illustrates a crossbar-memory lattice that stores 4, four-bit words.

FIG. 7 illustrates a hypothetical nanowire-crossbar memory that stores four, 4-bit words. In FIG. 7, each register is composed of a combination of high resistance nanowire junctions, each identified by the letter h, and low resistance nanowire junctions, each identified by the letter 1. Each register is identified by an address $R_i$. For example, $R_0$ is the address of the register that contains high resistance nanowire junction 701 and low resistance nanowire junctions 702-704. A binary word stored in a particular register is output by applying an appropriate voltage to the corresponding horizontal nanowire. The high resistance nanowire junctions permit a small amount of current to pass to connected vertical nanowires, and the low resistance nanowire junctions permit a relatively large amount of current to pass to connected vertical nanowires. Note that in many embodiments, low resistance nanowire junctions permit current levels of about 3 or more times greater than high resistance nanowire junctions. The current output along the vertical nanowires is used to read the binary word $D_3D_2D_1D_0$. For example, the word stored in register $R_0$ is revealed by applying a voltage to horizontal nanowire 705. Low resistance nanowire junctions 702-704 produce high current output at $D_2$, $D_1$, and $D_0$, and high resistance nanowire junction 701 produces a low current output at $D_3$. Because high output corresponds to the bit value "1," and low output corresponds to the bit value "0," the word stored in register $R_0$ is "0111." A table summarizing the words stored in the nanowire-crossbar memory of FIG. 7 is provided as follows:

| Register | Word |
|---|---|
| $R_0$ | 0111 |
| $R_1$ | 1000 |
| $R_2$ | 0100 |
| $R_3$ | 0011 |

Figure 8:
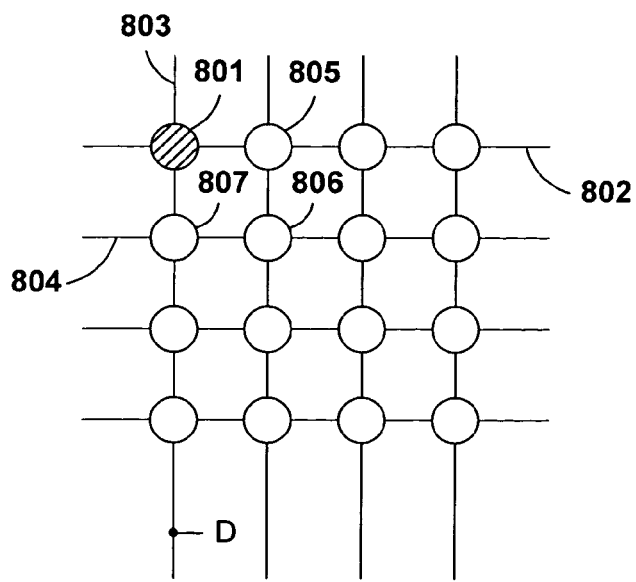
FIG. 8 illustrates a nanowire crossbar RAM.

FIG. 8 illustrates a nanowire crossbar RAM. In FIG. 8, hash-marked circle 801 identifies a nanowire junction having an unknown resistance state. Typically, in an attempt to determine the resistance of nanowire junction 801, a bias can be applied to horizontal nanowire 802, and a bias can be applied to vertical nanowire 803. A bias is a voltage that establishes a reference level for determining the resistance of a nanowire junction. Biases are also applied to the remaining horizontal and vertical nanowires in order to preserve the resistance states at the remaining nanowire junctions. The current level measured for vertical nanowire 803 can be used to assign the bit value D. However, the bit assigned to D may be incorrect because of a parasitic current that contributes to the current already flowing through vertical nanowire 803. For example, if nanowire junction 801 is originally configured to have a high resistance state, then the amount of current leaving nanowire junction 801 along vertical nanowire 803 is low. However, the biases applied to maintain the resistance states at nanowire junctions 805-807 can cause current to flow to horizontal nanowire 804 and then to vertical nanowire 803 to add to the amount current already leaving junction 801. Based on the current measured along vertical nanowire 803, it can be incorrectly concluded that junction 801 is in a low resistance state.

EMBODIMENTS OF THE PRESENT INVENTION

Figure 9:
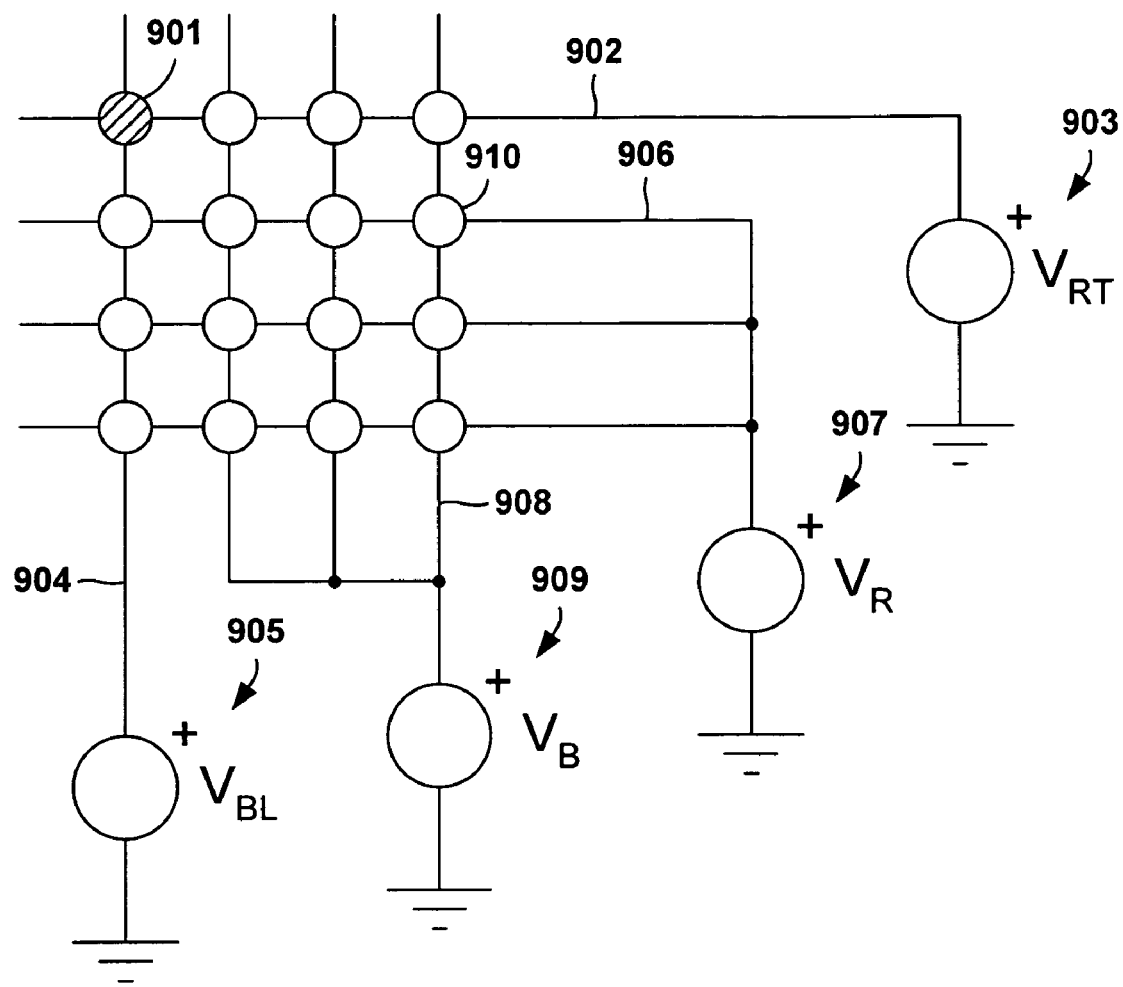
FIG. 9 illustrates one of many possible applications of voltages to determine the resistance state of a nanowire junction having an unknown resistance state.
Figure 10:
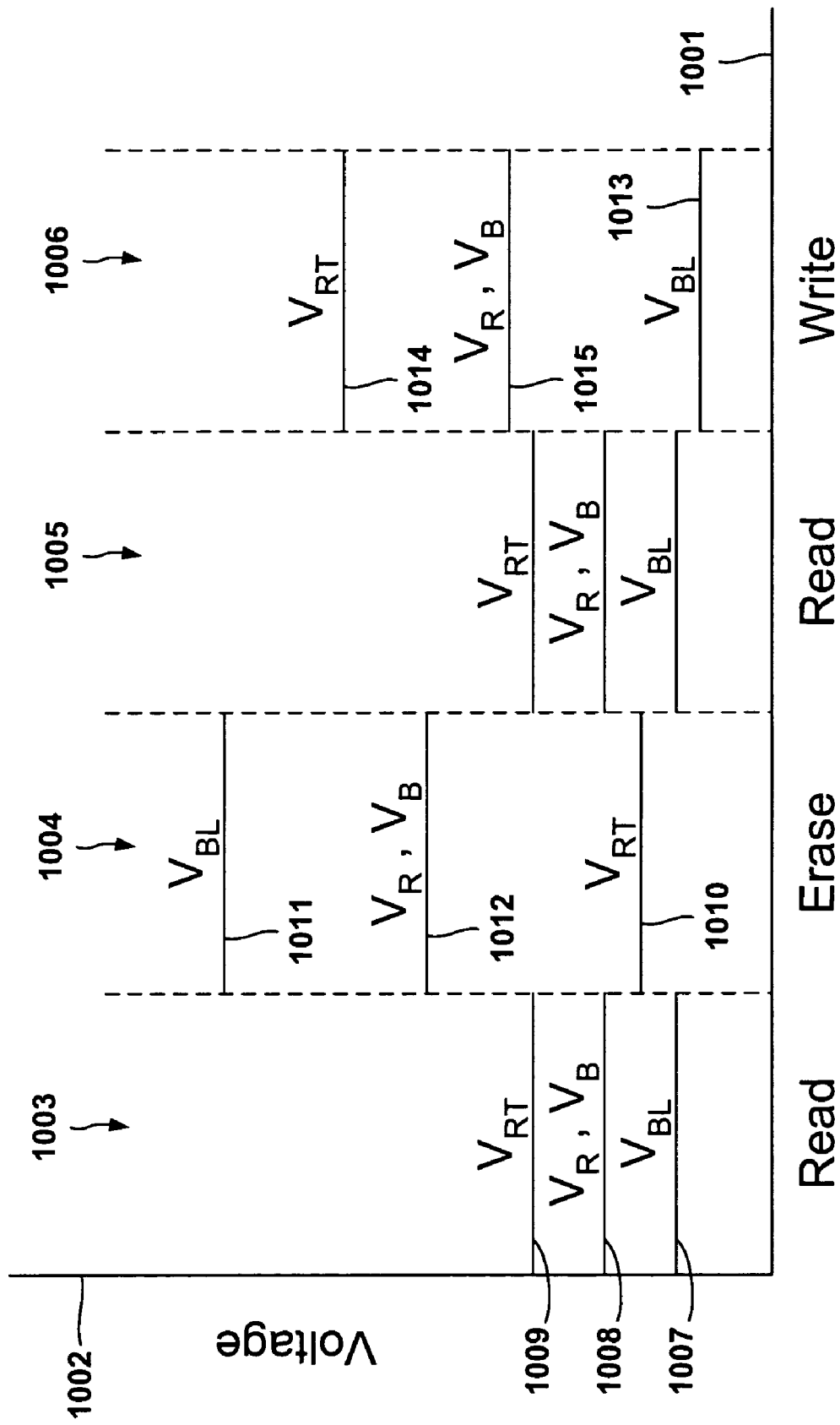
FIG. 10 illustrates a hypothetical application of an adaptive read method to determine the resistance of a nanowire junction in the crossbar memory shown in FIG. 9.

Various embodiments of the present invention are directed to adaptive read methods for determining the resistance states of crossbar RAM junctions. One adaptive read method is composed of three to four steps. FIGS. 9-10 illustrate a hypothetical application of one of many possible embodiments of the adaptive read method for determining the resistance of a crossbar-memory junction that has an unknown resistance state.

FIG. 9 illustrates one of many possible applications of voltages to determine the resistance state of a junction having an unknown resistance state. In FIG. 9, hash-marked circle 901 identifies a junction having an unknown resistance state. Horizontal nanowire 902 is biased with a voltage, denoted by $V_{RT}$, that emanates from voltage source 903, and vertical nanowire 904 is biased with voltage, denoted by $V_{BL}$, that emanates from voltage source 905. The remaining horizontal nanowires, such as horizontal nanowire 906, are biased with voltage, denoted by $V_R$, from voltage source 907, and the remaining vertical nanowires, such as vertical nanowire 908, are biased with a voltage, denoted by $V_B$, from voltage source 909. The voltages $V_R$ and $V_B$ are used to prevent the resistance states of the remaining junctions, denoted by open circles, such as junction 910, from changing during an application of the adaptive read method. For example, if junction 910 is set to a high resistance state, then the currents associated with voltages $V_R$ and $V_B$ that flow along horizontal nanowire 906 and vertical nanowire 908, respectively, prevent junction 910 from changing to a low resistance state.

FIG. 10 illustrates a hypothetical application of an adaptive read method to read the resistance of junction 901 in the crossbar memory shown in FIG. 9. In FIG. 10, horizontal axis 1001 represents the adaptive read method operations from left to right, and vertical axis 1002 represents the voltage levels of the $V_{RT}$, $V_{BL}$, $V_R$, and $V_B$ voltages described above with reference to FIG. 9. The operations begin with read operation 1003, followed by erase operation 1004, followed by another read operation 1005, and an optional write operation 1006. Note that the voltage levels displayed above each operation represent the relative change in voltages applied to the crossbar memory at each step and are not shown as a representation of a particular set of voltages that can be used to determine the resistance state of a junction.

In read operation 1003, an initial measurement of the current flowing through junction 901, shown in FIG. 9, is obtained after setting the $V_{BL}$ voltage at level 1007, the $V_R$ and $V_B$ voltages at voltage level 1008, and the $V_{RT}$ voltage at voltage level 1009. The amount of current is measured along vertical nanowire 904, shown in FIG. 9, and denoted by $I_i$, where i identifies the initial current reading for junction 901. Next, in erase operation 1004, the voltage levels of voltages $V_{RT}$ and $V_{BL}$ are changed to voltage levels 1010 and 1011, respectively, and voltages $V_R$ and $V_B$ are changed to voltage level 1012 in order to change the resistance state of junction 901 to a high resistance state. Note also that the $V_R$ and $V_B$ voltages are used to preserve the resistance states of junctions other than junction 901. Next, in read operation 1005, the voltages $V_{RT}$, $V_{BL}$, $V_R$ and $V_B$ are returned to the voltage levels in read operation 1003. The amount of current, denoted by $I_f$, is again measured for vertical nanowire 904, where the index f identifies the final current reading for junction 901. The currents, $I_i$ and $I_f$, can then be used to determine whether junction 901 was initially in a high resistance state or a low resistance state. If current $I_i$ is equal to current $I_f$, then junction 901 is identified as having been in a high resistance state. If current $I_f$ is less than current $I_i$, then junction 901 is identified as having been in a low resistance state, and in optional write operation 1006, the $V_{BL}$, $V_{RT}$ voltages are respectively set to the voltage levels 1013, 1014, and the $V_R$, and $V_B$ voltages are set to the voltage level 1015 to return junction 901 to a low resistance state.

Figure 11:
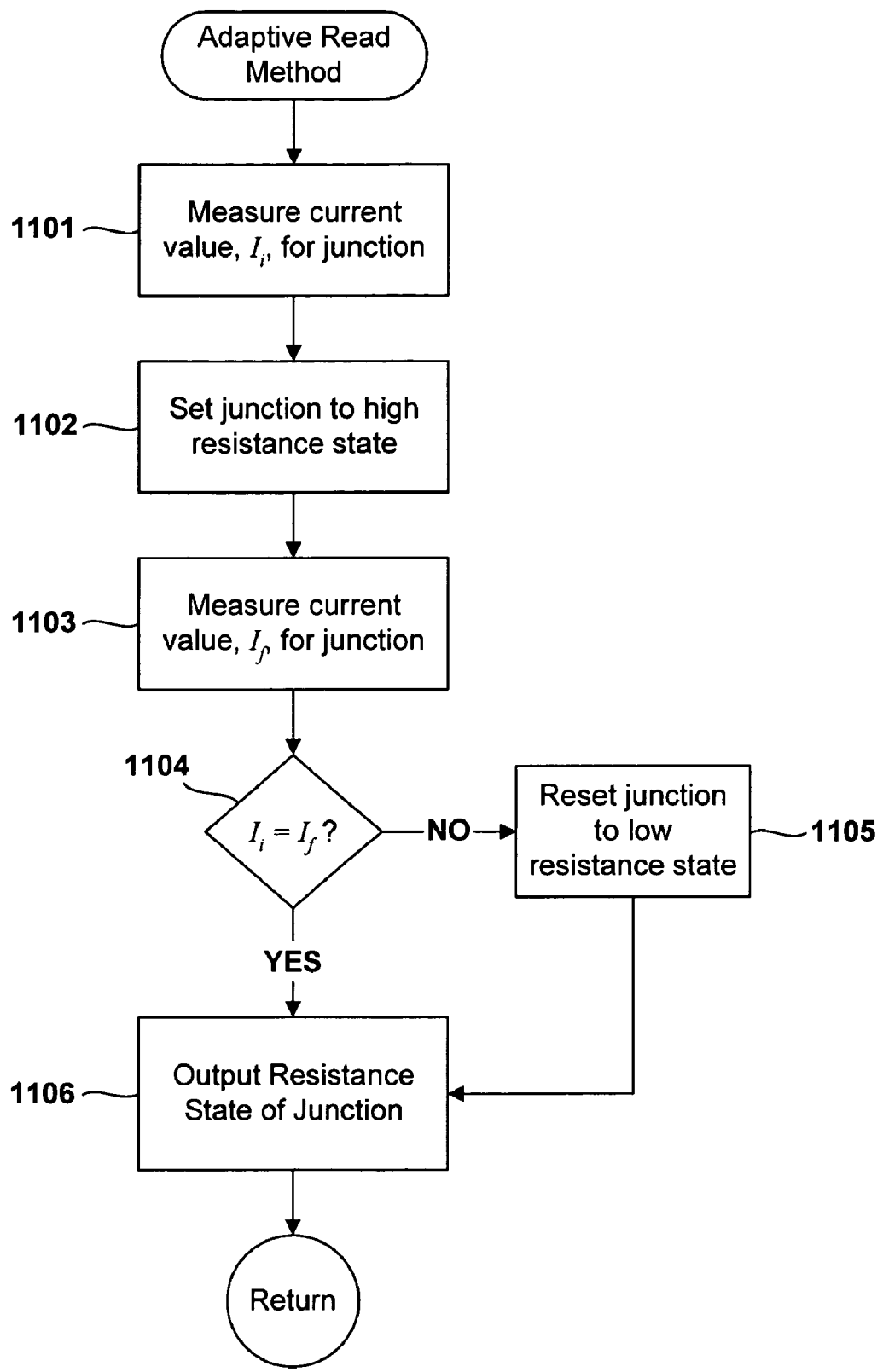
FIG. 11 is a control-flow diagram that represents one of many possible adaptive read methods of the present invention for determining the resistance state of crossbar-memory-nanowire junctions having an unknown resistance state.

FIG. 11 is a control-flow diagram that represents one of many possible methods of the present invention for determining the resistance state of a crossbar RAM junction having an unknown resistance state. In step 1101, an initial current value is measured for the junction by biasing the nanowires interconnected through the junction. In step 1102, the resistance state of the junction is set to a high resistance state by biasing the nanowires interconnected through the junctions. In step 1103, a final current value is measured for the junction by biasing the nanowires interconnected through the junction. In step 1104, if the initial and final current values are not equal, then control is passed to step 1105. Otherwise, control is passed to step 1106. In step 1105, the resistance state of the junction is reset to a low resistance state. In step 1106, the resistance state of the junction is output.

Although the present invention has been described in terms of a particular embodiment, it is not intended that the invention be limited to this embodiment. Modifications within the spirit of the invention will be apparent to those skilled in the art.

Any of many different logic circuit implementations may be used to implement the method of the present invention. For example, the currents or voltage associated with each of binary values "0" and "1" may be interchanged. As another example, voltage outputs, rather than current outputs, can be used to determine junction values. In an alternate embodiment, in step 1102, as described above in FIG. 11, the resistance state of the junction can be set to a low resistance for comparison in step 1104.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A method for determining a resistance state of a crossbar junction, the method comprising:
    biasing a pair of wires interconnected through the crossbar junction to determine a first signal level transmitted through the crossbar junction after biasing the pair of wires;
    biasing the pair of wires interconnected through the crossbar junction to increase the resistance of the crossbar junction;
    biasing the pair of wires interconnected through the crossbar junction to determine a second signal level transmitted through the crossbar junction after biasing the pair of wires; and
    outputting the resistance state of the crossbar junction based on comparing the first signal level to the second signal level.

2. The method of claim 1 wherein the crossbar junction is an element of a semiconductor crossbar memory.

3. The method of claim 1 wherein the crossbar junction is an element of a nanoscale crossbar memory.

4. The method of claim 1 wherein the crossbar junction includes a resistor.

5. The method of claim 1 wherein the crossbar junction includes a diode.

6. The method of claim 1 wherein the crossbar junction includes a field effect transistor.

7. The method of claim 1 further comprising biasing one or more pairs of wires interconnected through crossbar junctions neighboring the crossbar junction to prevent changes in the resistance states of the crossbar junctions neighboring the crossbar junction.

8. The method of claim 1 wherein outputting the resistance state of the crossbar junction further comprises outputting a high resistance state when the first signal level equals the second signal level.

9. The method of claim 1 wherein outputting the resistance state of the crossbar junction further comprises outputting a low resistance state when the second signal level is less than the first signal level.

10. The method of claim 9 further comprising biasing the pair of wire interconnecting through the crossbar junction to lower the resistance state of the crossbar junction.

11. A system for determining a resistance state of a crossbar junction, the system comprising:
    a means to bias wires interconnected through the crossbar junction;
    a means to detect a signal reflective of the state of the crossbar junction;
    logic that biases a pair of wires interconnected through the crossbar junction to determine a first signal level transmitted through the crossbar junction after biasing the pair of wires;

logic that biases the pair of wires interconnected through the crossbar junction to increase the resistance of the crossbar junction;

logic that biases the pair of wires interconnected through the crossbar junction to determine a second signal level transmitted through the crossbar junction after biasing the pair of wires; and logic that outputs the resistance state of the crossbar junction based on comparing the first signal level to the second signal level.

12. The system of claim 11 wherein the crossbar junction is an element of a semiconductor crossbar memory.

13. The system of claim 11 wherein the crossbar junction is an element of a nanoscale crossbar memory.

14. The system of claim 11 wherein the crossbar junction includes a resistor.

15. The system of claim 11 wherein the crossbar junction includes a diode.

16. The system of claim 11 wherein the crossbar junction includes a field effect transistor.

17. The system of claim 11 further comprises biases one or more pairs of wires interconnected through crossbar junctions neighboring the crossbar junction to prevent changes in the resistance states of the crossbar junctions neighboring the crossbar junction.

18. The system of claim 11 wherein outputting the resistance state of the crossbar junction further comprises outputting a high resistance state when the first signal level equals the second signal level.

19. The system of claim 11 wherein outputting the resistance state of the crossbar junction further comprises outputting a low resistance state when the second signal level is less than the first signal level.

20. The system of claim 19 further comprises biases the pair of wire interconnecting through the crossbar junction to lower the resistance state of the crossbar junction.

* * * * *